United States Patent
Shibahara

(10) Patent No.: US 7,429,905 B2
(45) Date of Patent: Sep. 30, 2008

(54) BALANCED ACOUSTIC WAVE FILTER

(75) Inventor: Teruhisa Shibahara, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/759,403

(22) Filed: Jun. 7, 2007

(65) Prior Publication Data

US 2007/0229193 A1 Oct. 4, 2007

Related U.S. Application Data

(63) Continuation of application No. PCT/JP2005/023261, filed on Dec. 19, 2005.

(30) Foreign Application Priority Data

Dec. 20, 2004 (JP) .............................. 2004-368245

(51) Int. Cl.
H03H 9/64 (2006.01)
(52) U.S. Cl. .................... 333/193; 333/195; 333/196
(58) Field of Classification Search ................. 333/193, 333/195

See application file for complete search history.

(56) References Cited

U.S. PATENT DOCUMENTS

| | | | |
|---|---|---|---|
| 4,425,554 A * | 1/1984 | Morishita et al. ........... 333/195 |
| 6,693,501 B2 | 2/2004 | Sawada et al. |
| 6,759,928 B2 | 7/2004 | Endou et al. |
| 6,768,397 B2 | 7/2004 | Takamine |
| 6,771,144 B2 * | 8/2004 | Takamine .................... 333/133 |
| 6,781,485 B2 | 8/2004 | Takamine et al. |
| 2001/0054942 A1 * | 12/2001 | Takamine et al. ........... 333/195 |
| 2002/0109431 A1 | 8/2002 | Yata et al. |
| 2002/0121842 A1 * | 9/2002 | Takamine ............... 310/313 B |
| 2003/0168932 A1 | 9/2003 | Shibata et al. |
| 2004/0066115 A1 | 4/2004 | Takamine |
| 2004/0066254 A1 | 4/2004 | Shibahara |
| 2004/0080383 A1 | 4/2004 | Takamine |

FOREIGN PATENT DOCUMENTS

| JP | 03-129915 A | 6/1991 |
|---|---|---|
| JP | 10-173470 | * 6/1998 |

(Continued)

OTHER PUBLICATIONS

Official Communication for PCT Application No. PCT/JP2005/023261; mailed on Apr. 4, 2006.

*Primary Examiner*—Barbara Summons
(74) *Attorney, Agent, or Firm*—Keating & Bennett, LLP

(57) ABSTRACT

An acoustic wave filter device includes a piezoelectric substrate and a longitudinally coupled resonator surface acoustic wave filter unit provided on the piezoelectric substrate. The surface acoustic wave filter unit includes first to fifth IDTs arranged in a surface wave propagation direction. The first, third, and fifth IDTs are connected to an unbalanced terminal, while the second and fourth IDTs are connected to first and second balanced terminals, respectively. The second IDT includes first and second sub-IDT portions obtained by dividing the second IDT and arranged in a crossing width direction, and the fourth IDT includes first and second sub-IDT portions obtained by dividing the fourth IDT and arranged in the crossing width direction. The first and second sub-IDT portions are connected in series. The first and second sub-IDT portions are also connected in series.

4 Claims, 4 Drawing Sheets

FOREIGN PATENT DOCUMENTS

| | | | |
|---|---|---|---|
| JP | 2000-091883 | * | 3/2000 |
| JP | 2001-292050 | * | 10/2001 |
| JP | 2001-313540 | A | 11/2001 |
| JP | 2002-171155 | A | 6/2002 |
| JP | 2002-290203 | A | 10/2002 |
| JP | 2002-300005 | A | 10/2002 |
| JP | 2003-069383 | A | 3/2003 |
| JP | 2003-289238 | A | 10/2003 |
| JP | 2004-088551 | A | 3/2004 |
| JP | 2004-112594 | A | 4/2004 |
| JP | 2004-140785 | A | 5/2004 |
| WO | 02/03549 | A1 | 1/2002 |
| WO | 2006/037477 | A1 | 4/2006 |

* cited by examiner

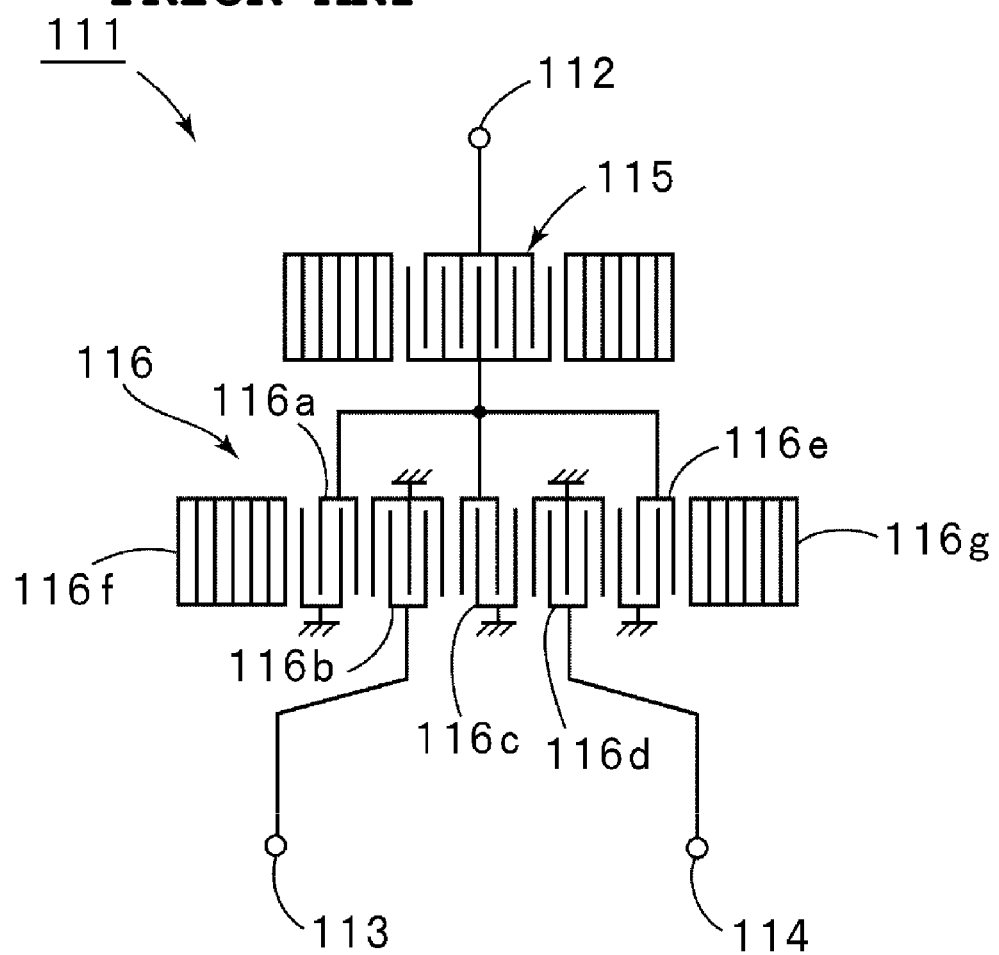

BALANCED ACOUSTIC WAVE FILTER

BACKGROUND OF THE INVENTION

1. Field of the Invention

The present invention relates to a balanced acoustic wave filter device having a balanced-unbalanced conversion function.

2. Description of the Related Art

A surface acoustic wave filter is often provided in mobile communication equipment as a band-pass filter between an antenna and a differential amplifier. In this case, the antenna inputs and outputs unbalanced signals, while the differential amplifier inputs and outputs balanced signals. Therefore, it is necessary to insert a component having an unbalanced-balanced conversion function between the antenna and the differential amplifier. If a surface acoustic wave filter having a balanced-unbalanced conversion function is used as a band-pass filter, a component which provides a balanced-unbalanced conversion function, that is, a balun, can be eliminated. Accordingly, various types of balanced surface acoustic wave filters having a balanced-unbalanced conversion function have been proposed.

Antennas typically have a characteristic impedance of about 50 ohms, while differential amplifiers have a characteristic impedance of at least about 100 ohms, or sometimes exceeding 1,000 ohms. Therefore, surface acoustic wave filters having a balanced-unbalanced conversion function must also provide an impedance conversion function.

Japanese Unexamined Patent Application Publication No. 2002-290203 (Patent Document 1) discloses a surface acoustic wave filter device having an impedance conversion function as well as a balanced-unbalanced conversion function.

FIG. 6 is a schematic plan view illustrating an electrode structure of a balanced surface acoustic wave filter device described in Patent Document 1. A surface acoustic wave filter device 101 includes an unbalanced terminal 102 and first and second balanced terminals 103 and 104. First and second longitudinally coupled resonator surface acoustic wave filters 105 and 106 are connected to the unbalanced terminal 102. The surface acoustic wave filters 105 and 106 are three-IDT longitudinally coupled resonator surface acoustic wave filters. The surface acoustic wave filter 105 includes first to third IDTs 105a to 105c, and the surface acoustic wave filter 106 includes first to third IDTs 106a to 106c. Reflectors 105d and 105e are arranged on either side of the IDTs 105a to 105c in a surface acoustic wave propagation direction, and reflectors 106d and 106e are arranged on either side of the IDTs 106a to 106c in the surface acoustic wave propagation direction.

The second IDTs 105b and 106b at the center are commonly connected to the unbalanced terminal 102. The IDTs 105a and 105c on both sides of the surface acoustic wave filter 105 are commonly connected to the first balanced terminal 103. Likewise, the first and third IDTs 106a and 106c of the surface acoustic wave filter 106 are commonly connected to the second balanced terminal 104. The first and second surface acoustic wave filters 105 and 106 have a phase difference of 180 degrees.

In the surface acoustic wave filter device 101 described in Patent Document 1, surface wave propagation paths of the first and second longitudinally coupled resonator surface acoustic wave filters 105 and 106 are arranged in the same direction. At the same time, the condition $d_1 \leq 2.3 \times t$ or $d_1 \geq 2.8 \times t$ is satisfied, where $d_1$ denotes the distance between the first and second surface acoustic wave filters 105 and 106 and t denotes the thickness of a piezoelectric substrate used.

As described in Patent Document 1, this configuration provides improved transmission characteristics.

Also in the surface acoustic wave filter device 101, the impedance of the unbalanced terminal 102 is about Z/2, where Z is the input impedance of each of the surface acoustic wave filters 105 and 106, because the impedance of the unbalanced terminal 102 is determined by connecting the input impedances of the surface acoustic wave filters 105 and 106 in parallel. The impedance between the first and second balanced terminals 103 and 104 is about 2Z, because this impedance is determined by connecting the impedances of the surface acoustic wave filters 105 and 106 in series. Therefore, the ratio of the impedance of the unbalanced terminal 102 to the impedance between the balanced terminals 103 and 104 is about 1:4.

On the other hand, Japanese Unexamined Patent Application Publication No. 2001-313540 (Patent Document 2) discloses a five-IDT longitudinally coupled resonator balanced surface acoustic wave filter device. FIG. 7 is a schematic plan view illustrating an electrode structure of the surface acoustic wave filter device described in Patent Document 2. A surface acoustic wave filter device 111 includes an unbalanced terminal 112 and first and second balanced terminals 113 and 114. A five-IDT longitudinally coupled resonator surface acoustic wave filter 116 is connected via a one-port surface acoustic wave resonator 115 to the unbalanced terminal 112.

The surface acoustic wave filter 116 includes first to fifth IDTs 116a to 116e arranged in a surface wave propagation direction. Reflectors 116f and 116g are arranged on either side of the IDTs 116a to 116e in the surface wave propagation direction.

First ends of the first, third, and fifth IDTs 116a, 116c, and 116e are mutually connected to the unbalanced terminal 112 via the surface acoustic wave resonator 115. First ends of the second and fourth IDTs 116b and 116d are connected to the first and second balanced terminals 113 and 114, respectively. The phase of the second IDT 116b differs by 180 degrees from fourth IDT 116d. This causes a phase difference of 180 degrees between signals output from the first and second balanced terminals 113 and 114.

If the IDTs 116b and 116d have the same phase and are connected electrically in parallel, input and output impedances are the same. However, since the IDTs 116b and 116d have a phase difference of 180 degrees and are connected to the first and second balanced terminals 113 and 114, respectively, the IDTs 116b and 116d are connected in series via the balanced terminal pair. In this case, the impedance of the balanced terminals 113 and 114 is four times the input impedance. Therefore, in the surface acoustic wave filter device 111, the ratio of the impedance of the unbalanced terminal 112 to the impedance of the balanced terminals 113 and 114 is about 1:4.

As described above, in the surface acoustic wave filter device 101 described in Patent Document 1, the ratio of the impedance of the unbalanced terminal 102 to the impedance of the balanced terminals 103 and 104 is about 1:4. Likewise, in the surface acoustic wave filter device 111 described in Patent Document 2, the ratio of the impedance of the unbalanced terminal 112 to the impedance of the balanced terminals 113 and 114 is about 1:4.

Therefore if, for example, an antenna has an input and output impedance of about 50 ohms and a differential amplifier connected downstream of a surface acoustic wave filter device has a characteristic impedance of about 200 ohms, the surface acoustic wave filter devices 101 and 111 described above can be preferably used.

However, recent differential amplifiers intended for this kind of use have a characteristic impedance of more than about 200 ohms, or sometimes as high as about 1,000 ohms, as described above.

Therefore, even when either of the surface acoustic wave filter devices 101 and 111 described in Patent Documents 1 and 2 is used, if a differential amplifier with such a high characteristic impedance is connected downstream thereof, it is necessary to provide an additional component for impedance conversion. In other words, the surface acoustic wave filter devices 101 and 111 described in Patent Documents 1 and 2 do not have a sufficient impedance conversion function. Therefore, it is desired to develop balanced surface acoustic wave filter devices capable of achieving a higher ratio of output impedance to input impedance.

At the same time, not only surface acoustic wave filters, but also acoustic wave filter devices using other types of acoustic waves, such as boundary acoustic waves, have been used in recent years. A boundary acoustic wave filter has IDTs on the boundary between a piezoelectric substrate and a dielectric laminated thereon, and uses boundary acoustic waves propagating along the boundary. Such a boundary acoustic wave filter can be made by forming an electrode that is substantially the same as that of a surface acoustic wave filter. Such acoustic wave filter devices in general are also desired to provide a high-ratio impedance conversion function as well as a balanced-unbalanced conversion function.

SUMMARY OF THE INVENTION

To overcome the problems described above, preferred embodiments of the present invention provide an acoustic wave filter device having not only a balanced-unbalanced conversion function, but also an impedance conversion function that achieves a higher ratio of impedance of balanced terminals to impedance of an unbalanced terminal.

According to a first preferred embodiment of the present invention, a longitudinally coupled resonator balanced acoustic wave filter device having an unbalanced terminal and first and second balanced terminals includes a piezoelectric substrate and first and second acoustic wave filter units of a longitudinally coupled resonator type, the first and second acoustic wave filter units being provided on the piezoelectric substrate. The first acoustic wave filter unit includes a second IDT connected to one of the unbalanced terminal and the first balanced terminal, and also includes first and third IDTs arranged on both sides of the second IDT in an acoustic wave propagation direction and connected to the other one of the first balanced terminal and the unbalanced terminal. The second acoustic wave filter unit includes a fifth IDT connected to one of the unbalanced terminal and the second balanced terminal, and also includes fourth and sixth IDTs arranged on both sides of the fifth IDT in the acoustic wave propagation direction and connected to the other one of the second balanced terminal and the unbalanced terminal. The first to sixth IDTs are configured such that a phase of an electric signal flowing to the first balanced terminal is different by 180 degrees from a phase of an electric signal flowing to the second balanced terminal. An IDT included in the first acoustic wave filter unit and connected to the first balanced terminal and an IDT included in the second acoustic wave filter unit and connected to the second balanced terminal each include at least first and second sub-IDT portions obtained by dividing the IDT in a crossing width direction that is substantially perpendicular to the acoustic wave propagation direction. The at least first and second sub-IDT portions are connected electrically in series.

According to a second preferred embodiment of the present invention, a longitudinally coupled resonator balanced acoustic wave filter device having an unbalanced terminal and first and second balanced terminals includes a piezoelectric substrate and an acoustic wave filter unit of a five-IDT longitudinally coupled resonator type, the acoustic wave filter unit being provided on the piezoelectric substrate. The acoustic wave filter unit includes first to fifth IDTs arranged in an acoustic wave propagation direction. The first, third, and fifth IDTs are connected to the unbalanced terminal. The second and fourth IDTs are connected to the first and second balanced terminals, respectively. The first to fifth IDTs are configured such that a phase of an electric signal flowing to the first balanced terminal is different by 180 degrees from a phase of an electric signal flowing to the second balanced terminal. The second and fourth IDTs each include at least first and second sub-IDT portions obtained by dividing the IDT in a crossing width direction that is substantially perpendicular to the acoustic wave propagation direction. The at least first and second sub-IDT portions are connected electrically in series.

Preferably, outermost electrode fingers that are located on outermost sides, in the acoustic wave propagation direction, of IDTs connected to the unbalanced terminal and are adjacent, in the acoustic wave propagation direction, to an IDT connected to the first or second balanced terminal are connected to ground.

In an IDT connected to either one of the first and second balanced terminals, series weighting may be applied to at least some electrode fingers including outermost electrode fingers that are not connected to ground, the at least some electrode fingers being adjacent, in the acoustic wave propagation direction, to outermost electrode fingers connected to ground and included in IDTs connected to the unbalanced terminal.

In the present invention, the term "acoustic wave filter device" refers not only to a filter device using surface acoustic waves, but also to a filter using other types of acoustic waves, such as boundary acoustic waves. In other words, the balanced acoustic wave filter device is not limited to a balanced surface acoustic wave filter device.

In the balanced acoustic wave filter device according to the first preferred embodiment, the first acoustic wave filter unit of a longitudinally coupled resonator type is disposed between the unbalanced terminal and the first balanced terminal, while the second acoustic wave filter unit of a longitudinally coupled resonator type is disposed between the unbalanced terminal and the second balanced terminal. At the same time, the first to sixth IDTs are configured such that a phase of an electric signal flowing to the first balanced terminal is different by 180 degrees from a phase of an electric signal flowing to the second balanced terminal. Therefore, the balanced acoustic wave filter device has a balanced-unbalanced conversion function.

Additionally, each of the second IDT and the fifth IDT includes at least first and second sub-IDT portions. The at least first and second sub-IDT portions are arranged in the crossing width direction that is substantially perpendicular to the acoustic wave propagation direction and are connected electrically in series. Therefore, the ratio of the impedance of the unbalanced terminal to that at the balanced terminals is about 1:16. Thus, a balanced acoustic wave filter device is provided which has a high-ratio impedance conversion function as well as a balanced-unbalanced conversion function.

In the acoustic wave filter device of the second preferred embodiment, the five-IDT longitudinally coupled resonator surface acoustic wave filter unit is provided on the piezoelectric substrate. The first, third, and fifth IDTs are connected to the unbalanced terminal, while the second and fourth IDTs are connected to the first and second balanced terminals, respectively. At the same time, the first to fifth IDTs are configured such that a phase of an electric signal flowing to the first balanced terminal is different by 180 degrees from a phase of an electric signal flowing to the second balanced terminal. Therefore, the balanced acoustic wave filter device of the second invention has a balanced-unbalanced conversion function.

Additionally, since each of the second IDT and the fourth IDT includes the at least first and second sub-IDT portions connected electrically in series, the ratio of the impedance of the unbalanced terminal to that at the balanced terminals is about 1:16. Therefore, according to the second preferred embodiment, an acoustic wave filter device is provided which has a high-ratio impedance conversion function as well as a balanced-unbalanced conversion function.

According to preferred embodiments of the present invention, if outermost electrode fingers that are adjacent, in the acoustic wave propagation direction, to an IDT connected to the first or second balanced terminal and are located on outermost sides, in the acoustic wave propagation direction, of IDTs connected to the unbalanced terminal are connected to ground, out-of-passband attenuation is effectively improved. More specifically, if the first and second sub-IDT portions are provided, the impedance between the first and second balanced terminals increases. Even if a parasitic capacitance between an IDT connected to a balanced terminal and an IDT connected to an unbalanced terminal is the same as that of a conventional configuration, the level of direct waves propagating to the balanced terminal is greater than that of the conventional configuration. Therefore, if the outermost electrode fingers described above are connected to ground, the effect of this direct waves is suppressed, and thus, out-of-passband attenuation is improved.

According to preferred embodiments of the present invention, if series weighting is applied to electrode fingers that are adjacent to outermost electrode fingers connected to ground and are, in an IDT connected to either one of the first and second balanced terminals, at least some electrode fingers including outermost electrode fingers not connected to ground, the series weighting provides a good balance between a signal level at the first balanced terminal and a signal level at the second balanced terminal and thus can improve the balance.

Other features, elements, steps, characteristics and advantages of the present invention will be described below with reference to preferred embodiments thereof and the attached drawings.

BRIEF DESCRIPTION OF THE DRAWINGS

FIG. 7 is a schematic plan view for illustrating another conventional balanced surface acoustic wave filter device.

DETAILED DESCRIPTION OF PREFERRED EMBODIMENTS

Preferred embodiments of the present invention will now be described with reference to the drawings.

Figure 1:
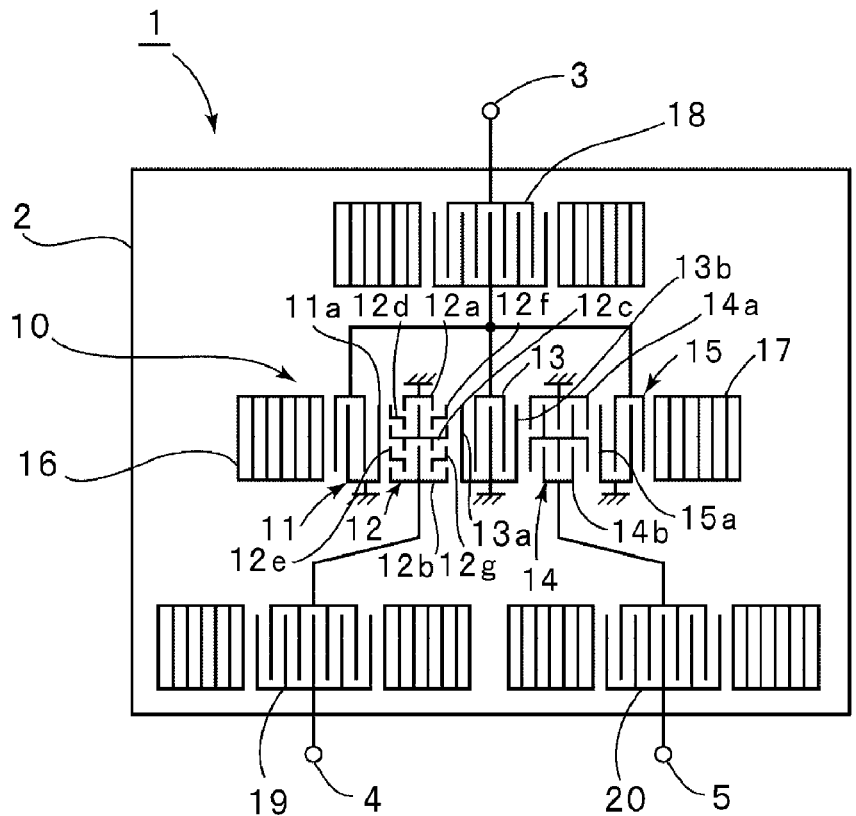
FIG. 1 is a schematic plan view of a surface acoustic wave filter device according to a first preferred embodiment of the present invention.

FIG. 1 is a schematic plan view of a surface acoustic wave filter device according to a first preferred embodiment of the present invention. A surface acoustic wave filter device 1 of the present preferred embodiment is preferably a five-IDT longitudinally coupled resonator surface acoustic wave filter device.

The surface acoustic wave filter device 1 includes a piezoelectric substrate 2 preferably made of a piezoelectric single crystal, such as $LiTaO_3$, $LiNbO_3$, or quartz, or piezoelectric ceramics. The piezoelectric substrate 2 may have a structure in which a piezoelectric thin film is provided on a substrate of piezoelectric material or on an insulating substrate.

The surface acoustic wave filter device 1 of the present preferred embodiment is a balanced surface acoustic wave filter device having a balanced-unbalanced conversion function and includes an unbalanced terminal 3 and first and second balanced terminals 4 and 5. A five-IDT longitudinally coupled resonator surface acoustic wave filter unit 10 is provided on the piezoelectric substrate 2. The surface acoustic wave filter unit 10 includes first to fifth IDTs 11 to 15 arranged in a surface wave propagation direction. Reflectors 16 and 17 are arranged on either side of the IDTs 11 to 15 in the surface wave propagation direction.

First ends of the first, third, and fifth IDTs 11, 13, and 15 are mutually connected to the unbalanced terminal 3 via a one-port surface acoustic wave resonator 18. Second ends of the IDTs 11, 13, and 15 are connected to ground. The IDTs 12 and 14 are connected via one-port surface acoustic wave resonators 19 and 20 to the first and second balanced terminals 4 and 5, respectively.

There is a phase difference of about 180 degrees between the second and fourth IDTs 12 and 14.

In the present preferred embodiment, the second IDT 12 includes first and second sub-IDT portions 12a and 12b obtained by dividing the second IDT 12 and arranged in a crossing width direction crossing the surface wave propagation direction, and the fourth IDT 14 includes first and second sub-IDT portions 14a and 14b obtained by dividing the fourth IDT 14 and arranged in the crossing width direction crossing the surface wave propagation direction. The first and second sub-IDT portions 12a and 12b are connected in series. The first and second sub-IDT portions 14a and 14b are also connected electrically in series.

An outermost electrode finger 11a located on one side of the first IDT 11 adjacent to the second IDT 12 is connected to ground. Outermost electrode fingers 13a and 13b located on either side of the third IDT 13 adjacent to the second and fourth IDTs 12 and 14, respectively, are also connected to ground. An outermost electrode finger 15a located on one side of the fifth IDT 15 adjacent to the fourth IDT 14 is also connected to ground.

In other words, outermost electrode fingers, in the acoustic wave propagation direction, of the IDT 11, 13, or 15 connected to the unbalanced terminal 3 and adjacent, in the surface acoustic wave propagation direction, to the second or fourth IDT 12 or 14 connected to the first or second balanced terminal 4 or 5, respectively, are connected to ground.

At the same time, in the second IDT 12, series weighting is applied to at least some electrode fingers including outermost electrode fingers not connected to ground. More specifically, the second IDT 12 includes a connection busbar 12c extending in the surface acoustic wave propagation direction at the center of the crossing width. The first and second sub-IDT portions 12a and 12b arranged in the crossing width direction are located on either side of the connection busbar 12c. The sub-IDT portions 12a and 12b are connected in series by the connection busbar 12c. In the sub-IDT portions 12a and 12b, series weighting is applied to two electrode fingers including an outermost electrode finger adjacent to the first IDT 11, such that floating electrode fingers 12d and 12e are provided. In the present preferred embodiment, in the sub-IDT portions 12a and 12b, series weighting is also applied to two electrode fingers including an outermost electrode finger adjacent to the third IDT 13, such that floating electrode fingers 12f and 12g are provided.

In other words, in the present preferred embodiment, in the IDT 12 connected to the first balanced terminal 4, the above-described series weighting is applied to at least some electrode fingers including outermost electrode fingers not connected to ground.

Since the surface acoustic wave filter device 1 of the present preferred embodiment is configured as described above, not only a balanced-unbalanced conversion function is provided, but also the ratio of the impedance of the unbalanced terminal 3 to the impedance of the balanced terminals 4 and 5 is about 1:16 and thus, better filter characteristics are achieved.

More specifically, the second IDT 12 and the fourth IDT 14 are opposite in phase, the second and fourth IDTs 12 and 14 are connected via the one-port surface acoustic wave resonators 19 and 20 to the first and second balanced terminals 4 and 5, respectively, and first ends of the first, third, and fifth IDTs 11, 13, and 15 are connected via the one-port surface acoustic wave resonator 18 to the unbalanced terminal 3. Therefore, the surface acoustic wave filter device 1 has a balanced-unbalanced conversion function.

Additionally, since the second IDT 12 includes the first and second sub-IDT portions 12a and 12b connected in series and the fourth IDT 14 includes the first and second sub-IDT portions 14a and 14b connected also in series, the ratio of the impedance of the unbalanced terminal 3 to that at the balanced terminals 4 and 5 is about 1:16.

That is, when an IDT is divided into two sub-IDTs portions in the crossing width direction and the resulting sub-IDT portions are connected in series, the characteristic impedance of the IDT is increased to four times the original value. Since the second IDT 12 connected to the first balanced terminal 4 has the first and second sub-IDT portions 12a and 12b and the fourth IDT 14 connected to the second balanced terminal 5 has the first and second sub-IDT portions 14a and 14b, the impedance of the balanced terminals 4 and 5 is four times that when the sub-IDT portions 12a, 12b, 14a, and 14b are not provided. In the surface acoustic wave filter device 1 of the present preferred embodiment, the first and second balanced terminals 4 and 5 are connected electrically in series and the impedance of the balanced terminals 4 and 5 is four times higher than that at the unbalanced terminal 3, while the characteristic impedance of the second and fourth IDTs 12 and 14 is made four times higher. Therefore, the ratio of the impedance of the unbalanced terminal 3 to that at the balanced terminals 4 and 5 is about 1:16. Thus, since a high-ratio impedance conversion function is provided, it is possible to directly connect a differential amplifier or other suitable component having a high characteristic impedance to the downstream of the surface acoustic wave filter device 1, without adding a component having an impedance conversion function.

Also, in the surface acoustic wave filter device 1 of the present preferred embodiment, outermost electrode fingers of the first, third, and fifth IDTs 11, 13, and 15 adjacent to the second IDT 12 and/or fourth IDT 14 are connected to ground. Therefore, electrode fingers connected to the unbalanced terminal 3 are not adjacent to electrode fingers connected to the balanced terminal 4 or 5 at any point in the surface wave propagation direction. Thus, it is possible to reduce the level of direct waves resulting from electromagnetic coupling between balanced and unbalanced signals and to increase out-of-passband attenuation. Furthermore, this reduction of the level of direct waves makes it possible to improve the balance.

Additionally, in the present preferred embodiment, in the second IDT 12, series weighting is applied to a plurality of electrode fingers including outermost electrode fingers, as described above. This improves the balance between signals of the balanced terminals 4 and 5, and thus, effectively improves the balance between the balanced terminals 4 and 5. More specifically, since there is a phase difference of about 180 degrees between the second and fourth IDTs 12 and 14, a boundary between the IDTs 12 and 13 differs in polarity from that between the IDTs 13 and 14. If the series weighting described above is not applied to the second IDT 12, the excitation and reception of surface acoustic waves occur to a significant degree at the boundaries on both sides of the second IDT 12 in the surface wave propagation direction, while the excitation and reception of surface acoustic waves occur to a lesser degree at the boundaries on both sides of the second IDT 14 in the surface wave propagation direction. This may deteriorate the balance between electric signals of the first and second balanced terminals and the balance between the first and second balanced terminals.

However, in the present preferred embodiment, the above-described series weighting is applied to both sides of the second IDT 12 in the surface acoustic wave propagation direction. Since this causes interference to the excitation and reception of surface acoustic waves at the boundary between the IDTs 12 and 11 and that between the IDTs 12 and 13, the behavior of excitation and reception of surface acoustic waves at the boundaries on both sides of the IDT 12 is closer to the behavior of excitation and reception of surface acoustic waves at the boundaries on both sides of the IDT 14 in the surface wave propagation direction. This makes it possible to improve the balance.

Figure 2:
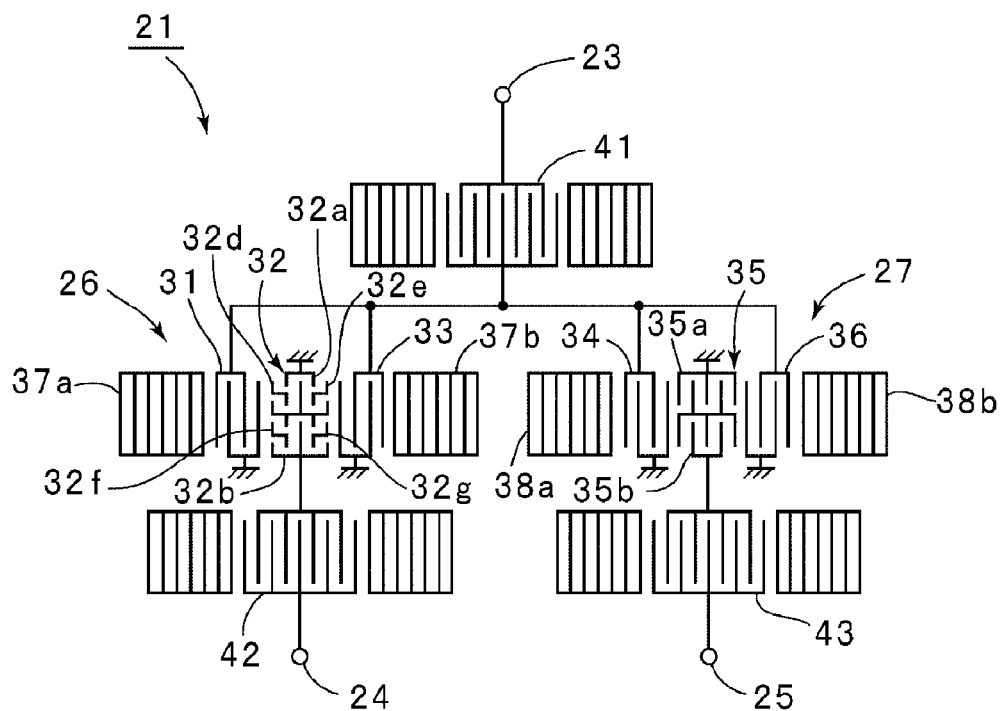
FIG. 2 is a schematic plan view illustrating an electrode structure of a surface acoustic wave filter device according to a second preferred embodiment of the present invention.

FIG. 2 is a schematic plan view illustrating an electrode structure of a surface acoustic wave filter device according to a second preferred embodiment of the present invention. In a surface acoustic wave filter device 21 of the present preferred embodiment, the illustrated electrode structure is provided on a piezoelectric substrate. That is, the surface acoustic wave filter device 21 includes an unbalanced terminal 23 and first and second balanced terminals 24 and 25.

The surface acoustic wave filter device 21 includes first and second longitudinally coupled resonator surface acoustic wave filter units 26 and 27 of a three-IDT type. The first longitudinally coupled resonator surface acoustic wave filter unit 26 includes first to third IDTs 31 to 33 arranged in a surface wave propagation direction. Likewise, the second longitudinally coupled resonator surface acoustic wave filter unit 27 includes fourth to sixth IDTs 34 to 36 arranged in the surface wave propagation direction. In other words, both of the first and second longitudinally coupled resonator surface acoustic wave filter units 26 and 27 are three-IDT longitudinally coupled resonator surface acoustic wave filter units.

Reflectors 37a and 37b are arranged on either side of the IDTs 31 to 33 in the surface wave propagation direction. Likewise, reflectors 38a and 38b are arranged on either side of the fourth to sixth IDTs 34 to 36 in the surface wave propagation direction.

In the present preferred embodiment, first ends of the first and third IDTs 31 and 33 of the first longitudinally coupled resonator surface acoustic wave filter unit 26 are mutually connected to the fourth and sixth IDTs 34 and 36 of the second longitudinally coupled resonator surface acoustic wave filter unit 27, and further connected via a one-port surface acoustic wave resonator 41 to the unbalanced terminal 23. Second ends of the first and third IDTs 31 and 33 are connected to ground. Second ends of the fourth and sixth IDTs are also connected to ground.

At the same time, first ends of the second and fifth IDTs 32 and 35 are connected via one-port surface acoustic wave resonators 42 and 43 to the first and second balanced terminals 24 and 25, respectively. There is a phase difference of about 180 degrees between the second and fifth IDTs 32 and 35. Therefore, the surface acoustic wave filter device 21 has a balanced-unbalanced conversion function.

In the present preferred embodiment, the second IDT 32 includes first and second sub-IDT portions 32a and 32b obtained by dividing the second IDT 32 and arranged in a crossing width direction, and the fifth IDT 35 includes first and second sub-IDT portions 35a and 35b obtained by dividing the fifth IDT 35 and arranged in the crossing width direction. The first and second sub-IDT portions 32a and 32b are connected electrically in series, and the first and second sub-IDT portions 35a and 35b are also connected electrically in series. Thus, as in the surface acoustic wave filter device 1 of the first preferred embodiment, in the surface acoustic wave filter device 21 of the present preferred embodiment, the characteristic impedance of the second and fifth IDTs 32 and 35 is four times that when the sub-IDT portions 32a, 32b, 35a, and 35b are not provided. Therefore, in the present preferred embodiment, the ratio of the impedance of the unbalanced terminal 23 to that at the first and second balanced terminals 24 and 25 is also about 1:16.

Also, outermost electrode fingers of the first and third IDTs 31 and 33 adjacent to the second IDT 32 are connected to ground. Likewise, outermost electrode fingers of the fourth and sixth IDTs 34 and 36 adjacent to the fifth IDT 35 are connected to ground. Since providing the sub-IDT portions 32a, 32b, 35a, and 35b causes an increase in impedance between the balanced terminals 24 and 25, the level of direct waves propagating to the balanced terminals 24 and 25 may be increased. However, since the outermost electrode fingers of the first and third IDTs 31 and 33 adjacent to the second IDT 32 and the outermost electrode fingers of the fourth and sixth IDTs 34 and 36 adjacent to the fifth IDT 35 are connected to ground, the level of direct waves described above can be reduced.

Additionally, series weighting is applied to a plurality of electrode fingers including outermost electrode fingers of the sub-IDT portions 32a and 32b in the surface wave propagation direction. This series weighting is performed by providing, on both sides of the sub-IDT portions 32a and 32b in the surface wave propagation direction, floating electrode fingers 32d, 32e, 32f, and 32g at the location of the plurality of electrode fingers including the outermost electrode fingers. This series weighting increases the balance between signals of the balanced terminals 24 and 25, and thus, improves the balance between the balanced terminals 24 and 25. That is, as when series weighting is applied to the second IDT 12 of the first preferred embodiment, the application of series weighting interferes with the excitation and reception of acoustic waves at the IDT-IDT boundaries on both sides of the second IDT 32 in the surface wave propagation direction. Then, the level of this excitation and reception of surface acoustic waves is substantially the same as the level of excitation and reception of surface acoustic waves at the IDT-IDT boundaries on both sides of the fifth IDT 35 in the surface wave propagation direction. Therefore, the balance between the balanced terminals 24 and 25 is improved.

In the second preferred embodiment, first ends of the first, third, fourth, and sixth IDTs 31, 33, 34, 36 are mutually connected to the unbalanced terminal 23, while the second and fifth IDTs 32 and 35 are connected to the first and second balanced terminals 24 and 25, respectively. Alternatively, the surface acoustic wave filter device 21 of the present preferred embodiment may be configured such that first ends of the second and fifth IDTs 32 and 35 are mutually connected to the unbalanced terminal 23, first ends of the first and third IDTs 31 and 33 are mutually connected to the first balanced terminal 24, and first ends of the fourth and sixth IDTs 34 and 36 are mutually connected to the second balanced terminal 25, thereby providing a balanced-unbalanced conversion function. In this case, each of the first, third, fourth, and sixth IDTs is configured to have first and second sub-IDT portions connected in series as described above. A high-ratio impedance conversion function is thus achieved.

As can be seen from the first and second preferred embodiments, in the present invention, if each IDT of a pair of IDTs that are connected to respective balanced terminals and are opposite in phase is configured to have first and second sub-IDT portions connected in series as described above, an improved impedance conversion function is achieved. As long as this configuration is maintained, the acoustic wave device of the present invention can be modified is a variety of ways.

Figure 3:
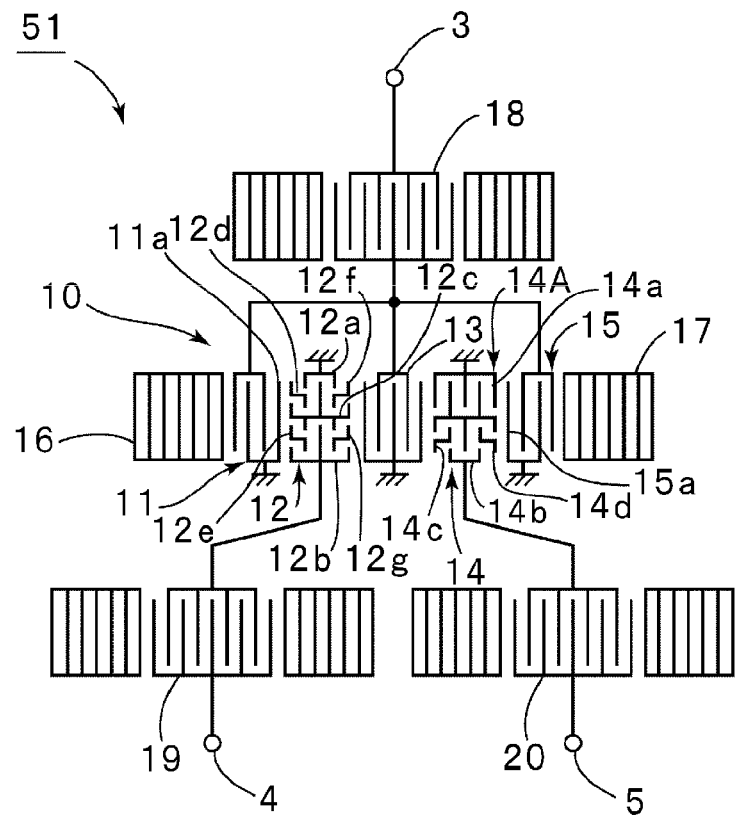
FIG. 3 is a schematic plan view illustrating an electrode structure of a surface acoustic wave filter device according to a modification of the first preferred embodiment of the present invention.

FIG. 3 is a schematic plan view illustrating a modification of the surface acoustic wave filter device 1 according to the first preferred embodiment. FIG. 3 illustrates an electrode structure of a surface acoustic wave filter device 51 of the present modification. The surface acoustic wave filter device 51 has the same configuration as that of the surface acoustic wave filter device 1 except that, in a fourth IDT 14A, series weighting is applied to both sides of the second sub-IDT portion 14b in the surface wave propagation direction. That is, floating electrode fingers 14c and 14d are arranged such that they extend to electrode fingers including outermost electrode fingers on both sides of the second sub-IDT portion 14b in the surface wave propagation direction and thus, series weighting is performed.

As described above, the series weighting may be performed not only in the second IDT 12 connected to the first balanced terminal 4, but also in the fourth IDT 14A connected to the second balanced terminal 5. As will be seen from FIG. 3, however, series weighting is applied only to the sub-IDT portion 14b and not to the sub-IDT portion 14a in the fourth IDT 14A. The series weighting is performed to reduce the level of excitation and reception of surface acoustic waves at IDT-IDT boundaries. Therefore, the series weighting is applied according to the difference between the IDT 12 and the IDT 14A in terms of the level of excitation and reception of surface acoustic waves at IDT-IDT boundaries on their both sides. If the level of excitation and reception of surface acoustic waves at the IDT-IDT boundaries of the IDT 12 is significantly different from the level of excitation and reception of surface acoustic waves at the IDT-IDT boundaries on both sides of the IDT 14 in the surface wave propagation direction, it is preferable, as in the case of the first preferred embodiment, not to apply series weighting to the IDT 14. If, as in the case of the present modification, there is no significant difference in the level of reception of surface acoustic waves between the second IDT 12 and the fourth IDT 14A, series weighting may be applied to the fourth IDT 14A as described above.

Figure 4:
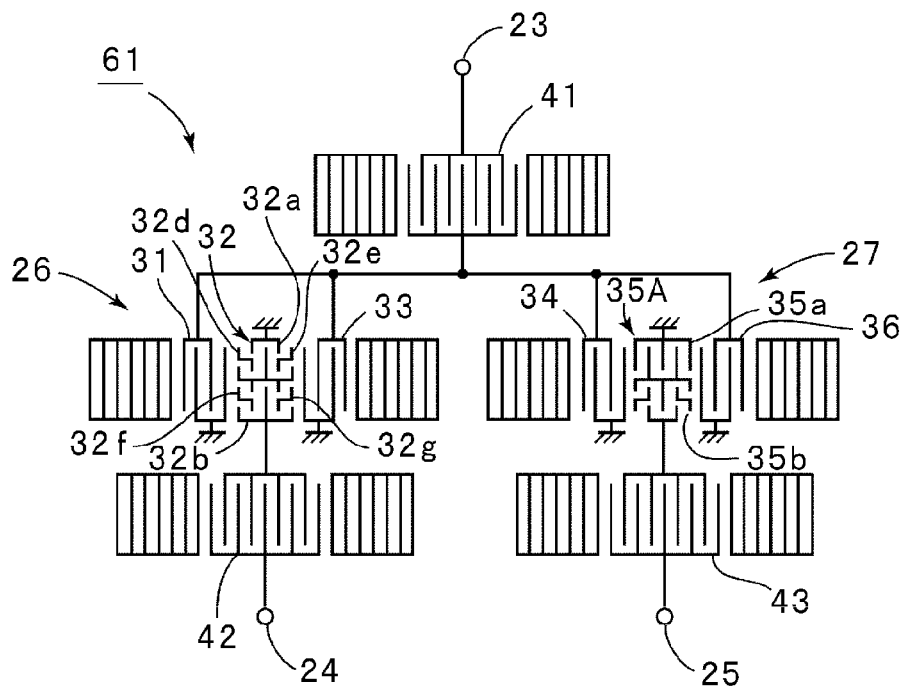
FIG. 4 is a schematic plan view illustrating an electrode structure of a surface acoustic wave filter device according to a modification of the second preferred embodiment of the present invention.

FIG. 4 is a schematic plan view illustrating a modification of the surface acoustic wave filter device 21 according to the second preferred embodiment. A surface acoustic wave filter device 61 of the present modification has the same configuration as that of the surface acoustic wave filter device 21 of the second preferred embodiment except that series weighting is applied to a plurality of electrode fingers including outermost electrode fingers of the second sub-IDT portion 35b in a fifth IDT 35A. In other words, in the surface acoustic wave filter device 21 of the second preferred embodiment, series weighting may be applied only to the sub-IDT portion 35b of the fifth IDT 35 depending on the difference between the second IDT 32 and the fifth IDT 35 in terms of the level of excitation and reception of surface acoustic waves at IDT-IDT boundaries on their both sides.

In either of the surface acoustic wave filter devices 1 and 21 of the first and second preferred embodiments illustrated in FIGS. 1 and 2, series weighting is applied to both first and second sub-IDT portions of a second IDT. However, series weighting may be applied to only one of the first and second sub-IDT portions of the second IDT.

Additionally, each of the surface acoustic wave filter devices 1, 21, 51, and 61 of the first and second preferred embodiments and their modifications illustrated in FIGS. 1, 2, 3, and 4 is preferably configured to have first and second sub-IDT portions arranged in a crossing width direction. However, each of the surface acoustic wave filter devices 1, 21, 51, and 61 may be configured to have first, second, and third sub-IDT portions arranged in the crossing width direction, or have four or more sub-IDT portions arranged in the crossing width direction.

Figure 5:
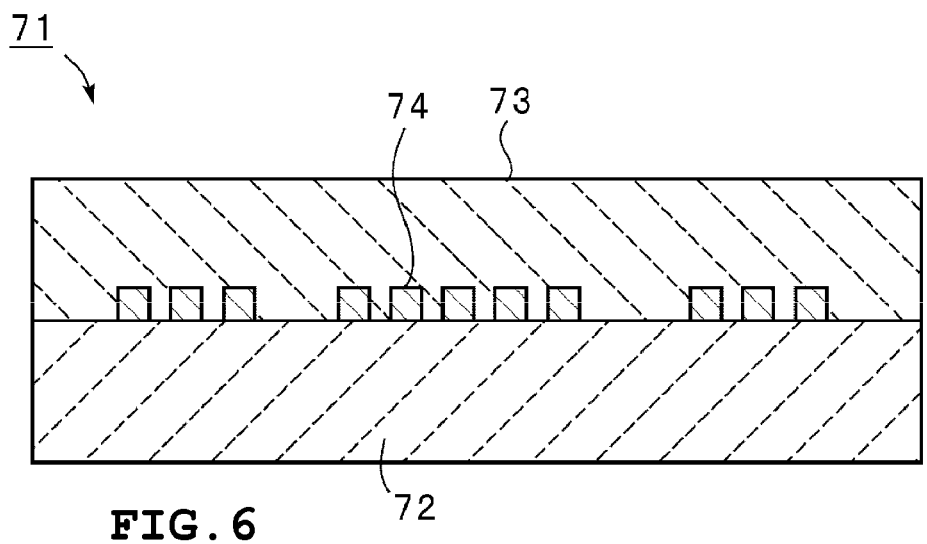
FIG. 5 is a schematic front cross-sectional view of a boundary acoustic wave device to which a preferred embodiment of the present invention is applied.
Figure 6:
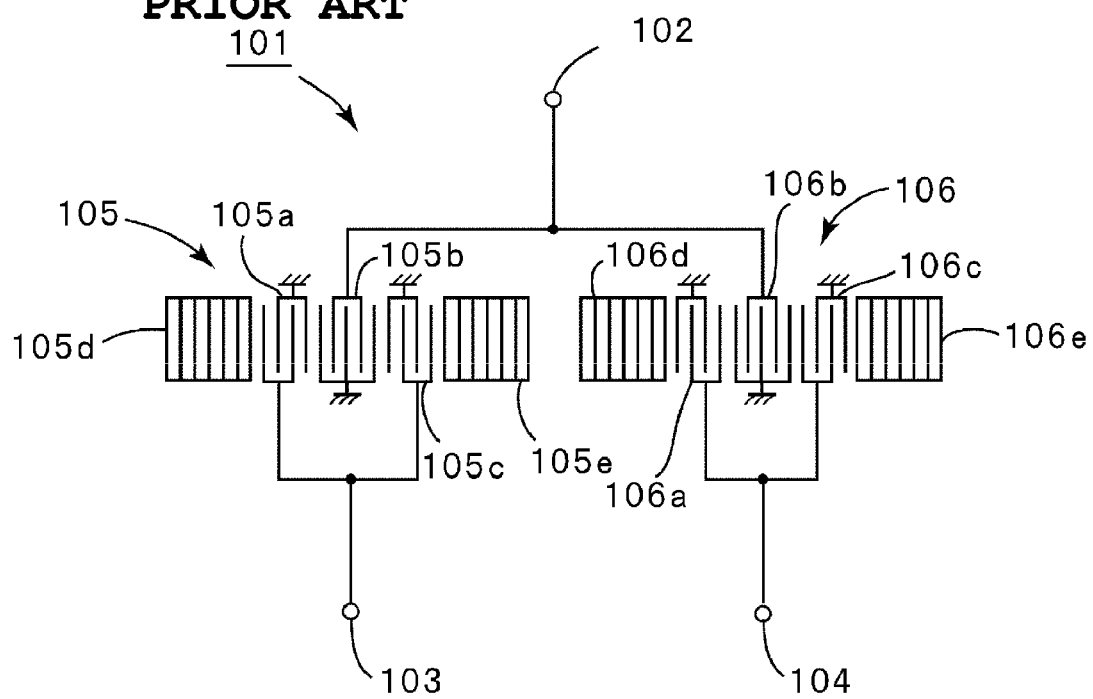
FIG. 6 is a schematic plan view for illustrating a conventional balanced surface acoustic wave filter device.

The surface acoustic wave filter devices of the first and second preferred embodiments and their modifications preferably use surface acoustic waves as described above. However, instead of using surface acoustic waves, other types of acoustic waves, such as boundary acoustic waves, may be used in the present invention. FIG. 5 is a schematic front cross-sectional view of a boundary acoustic wave filter device. In a boundary acoustic wave filter device 71, a dielectric material 73 serving as a second medium is formed on a piezoelectric substrate 72 serving as a first medium. An electrode 74 having a plurality of IDTs is formed on the boundary between the piezoelectric substrate 72 and the dielectric material 73. The boundary acoustic wave filter device 71 uses boundary acoustic waves propagating along this boundary plane to provide the characteristics of a filter. In this case, if the electrode 74 of the boundary acoustic wave filter device 71 has the same configuration as that of the electrode structure of a surface acoustic wave filter according to any one of the preferred embodiments described above, an acoustic wave filter device of the present invention can be obtained.

In the preferred embodiments and their modifications described above, each IDT is connected via an appropriate one-port surface acoustic wave resonator to the unbalanced terminal 3 or 23, or balanced terminal 4, 5, 24, or 25. However, such a one-port surface acoustic wave resonator is not necessarily provided.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced acoustic wave filter device having an unbalanced terminal and first and second balanced terminals, the device comprising:

a piezoelectric substrate; and first and second longitudinally coupled resonator type acoustic wave filter units, the first and second acoustic wave filter units being provided on the piezoelectric substrate; wherein the first acoustic wave filter unit includes a second IDT connected to one of the unbalanced terminal and the first balanced terminal, and also includes first and third IDTs arranged on both sides of the second IDT in an acoustic wave propagation direction and connected to the other one of the first balanced terminal and the unbalanced terminal;

the second acoustic wave filter unit includes a fifth IDT connected to one of the unbalanced terminal and the second balanced terminal, and also includes fourth and sixth IDTs arranged on both sides of the fifth IDT in the acoustic wave propagation direction and connected to the other one of the second balanced terminal and the unbalanced terminal;

the first to sixth IDTs are configured such that a phase of an electric signal flowing to the first balanced terminal is different by 180 degrees from a phase of an electric signal flowing to the second balanced terminal; and an IDT included in the first acoustic wave filter unit and connected to the first balanced terminal and an IDT included in the second acoustic wave filter unit and connected to the second balanced terminal each include at least first and second sub-IDT portions obtained by dividing the IDT and arranged in a crossing width direction that is substantially perpendicular to the acoustic wave propagation direction, and the at least first and second sub-IDT portions are connected electrically in series; and outermost electrode fingers that are located on outermost sides, in the acoustic wave propagation direction, of IDTs connected to the unbalanced terminal and are adjacent, in the acoustic wave propagation direction, to an IDT connected to the first or second balanced terminal, are connected to ground.

2. The balanced acoustic wave filter device according to claim 1, wherein, in an IDT connected to either one of the first and second balanced terminals, series weighting is applied to at least some electrode fingers including outermost electrode fingers that are not connected to ground, the at least some electrode fingers being adjacent, in the acoustic wave propagation direction, to outermost electrode fingers connected to ground and included in IDTs connected to the unbalanced terminal.

3. A balanced acoustic wave filter device having an unbalanced terminal and first and second balanced terminals, the device comprising:

a piezoelectric substrate; and a five-IDT longitudinally coupled resonator type acoustic wave filter unit, the acoustic wave filter unit being provided on the piezoelectric substrate; wherein the acoustic wave filter unit includes first to fifth IDTs arranged in an acoustic wave propagation direction, the first, third, and fifth IDTs are connected to the unbalanced terminal, and the second and fourth IDTs are connected to the first and second balanced terminals, respectively;

the first to fifth IDTs are configured such that a phase of an electric signal flowing to the first balanced terminal is different by 180 degrees from a phase of an electric signal flowing to the second balanced terminal; and the second and fourth IDTs each include at least first and second sub-IDT portions obtained by dividing the IDT and arranged in a crossing width direction crossing the acoustic wave propagation direction, and the at least first and second sub-IDT portions are connected electrically in series; and outermost electrode fingers that are located on outermost sides, in the acoustic wave propagation direction, of IDTs connected to the unbalanced terminal and are adjacent, in the acoustic wave propagation direction, to an IDT connected to the first or second balanced terminal, are connected to ground.

4. The balanced acoustic wave filter device according to claim 3, wherein, in an IDT connected to either one of the first and second balanced terminals, series weighting is applied to at least some electrode fingers including outermost electrode fingers that are not connected to ground, the at least some electrode fingers being adjacent, in the acoustic wave propagation direction, to outermost electrode fingers connected to ground and included in IDTs connected to the unbalanced terminal.

* * * * *